(12) United States Patent
Lu et al.

(10) Patent No.: US 11,222,830 B2
(45) Date of Patent: Jan. 11, 2022

(54) HEAT DISSIPATION STRUCTURE AND ELECTRONIC DEVICE

(71) Applicant: Lenovo (Beijing) Co., Ltd., Beijing (CN)

(72) Inventors: Xiaogang Lu, Beijing (CN); Guodong Jiang, Beijing (CN); Zhirong Gao, Beijing (CN)

(73) Assignee: LENOVO (BEIJING) CO., LTD., Beijing (CN)

(*) Notice: Subject to any disclaimer, the term of this patent is extended or adjusted under 35 U.S.C. 154(b) by 217 days.

(21) Appl. No.: 16/238,623

(22) Filed: Jan. 3, 2019

(65) Prior Publication Data
US 2019/0206760 A1   Jul. 4, 2019

(30) Foreign Application Priority Data

Jan. 3, 2018 (CN) .......................... 201810004320.2
Jan. 16, 2018 (CN) .......................... 201810042365.9

(51) Int. Cl.
| | |
|---|---|
| *H01L 23/367* | (2006.01) |
| *F28F 3/02* | (2006.01) |
| *G06F 1/20* | (2006.01) |
| *H01L 23/373* | (2006.01) |
| *H01L 23/467* | (2006.01) |

(52) U.S. Cl.
CPC ............ *H01L 23/3672* (2013.01); *F28F 3/02* (2013.01); *G06F 1/20* (2013.01); *H01L 23/3736* (2013.01); *F28F 2215/08* (2013.01); *H01L 23/373* (2013.01); *H01L 23/467* (2013.01)

(58) Field of Classification Search
CPC ............ H01L 23/3672; H01L 23/367; H01L 2023/4056; H01L 2023/405; H01L 2023/4043; H01L 2023/4037; G06F 1/20; F28F 13/02; F28F 13/08; H05K 7/20909; H05K 7/209; H05K 7/205; H05K 7/20436; H05K 7/20409; H05K 7/2039; H05K 7/20

See application file for complete search history.

(56) References Cited

U.S. PATENT DOCUMENTS

| | | | | |
|---|---|---|---|---|
| 4,408,659 A | * | 10/1983 | Hermanns | F28D 13/00 165/10 |
| 4,682,268 A | * | 7/1987 | Okano | H05K 7/20154 361/697 |
| 5,003,429 A | * | 3/1991 | Baker | H05K 7/20509 165/185 |
| 5,038,858 A | * | 8/1991 | Jordan | H01L 23/3672 165/185 |
| 5,724,228 A | | 3/1998 | Lee | |

(Continued)

FOREIGN PATENT DOCUMENTS

| | | | |
|---|---|---|---|
| CN | 2909522 Y | | 6/2007 |
| CN | 2909522 Y | * | 6/2007 |

(Continued)

*Primary Examiner* — Earl N Taylor
(74) *Attorney, Agent, or Firm* — Anova Law Group, PLLC

(57) ABSTRACT

A heat dissipation structure is provided for an electronic device. The heat dissipation structure includes a substrate and cooling fins connected to the substrate. The substrate includes a thermally conductive material. A first surface of the substrate has a plurality of contact regions. The plurality of contact regions of the first surface contact at least one device to be cooled.

5 Claims, 8 Drawing Sheets

(56) References Cited

U.S. PATENT DOCUMENTS

| | | | | |
|---|---|---|---|---|
| 6,140,571 | A * | 10/2000 | Kitahara | G03F 7/70433 |
| | | | | 165/185 |
| 6,230,789 | B1 * | 5/2001 | Pei | F28F 3/06 |
| | | | | 165/185 |
| 6,397,926 | B1 * | 6/2002 | Sato | H01L 23/367 |
| | | | | 165/80.3 |
| 7,228,887 | B2 * | 6/2007 | Chen | H01L 23/3672 |
| | | | | 165/185 |
| 7,891,410 | B1 * | 2/2011 | Monson | H01L 23/467 |
| | | | | 165/80.2 |
| 8,902,589 | B2 * | 12/2014 | Gohara | H01L 23/3735 |
| | | | | 361/699 |
| 9,609,739 | B2 * | 3/2017 | Kamimura | H05K 5/0213 |
| 9,788,460 | B2 * | 10/2017 | Barron | H05K 1/0203 |
| 9,806,247 | B2 * | 10/2017 | Hammer | F01D 15/10 |
| 2002/0018336 | A1 | 2/2002 | Liang et al. | |
| 2004/0134646 | A1 * | 7/2004 | Chu | F28F 3/02 |
| | | | | 165/185 |
| 2005/0039885 | A1 * | 2/2005 | Vaidyanathan | H01L 23/3731 |
| | | | | 165/80.4 |
| 2005/0068739 | A1 * | 3/2005 | Arvelo | H01L 23/42 |
| | | | | 361/718 |
| 2006/0185820 | A1 * | 8/2006 | Chen | H01L 23/3736 |
| | | | | 165/80.3 |
| 2009/0242186 | A1 * | 10/2009 | Koshiyama | G06F 1/181 |
| | | | | 165/288 |
| 2010/0315787 | A1 * | 12/2010 | Li | H05K 1/0206 |
| | | | | 361/709 |
| 2011/0100604 | A1 * | 5/2011 | Anzai | H01L 23/427 |
| | | | | 165/104.21 |
| 2011/0110035 | A1 * | 5/2011 | Cheng | H01L 23/467 |
| | | | | 361/690 |
| 2012/0097377 | A1 * | 4/2012 | Arik | H01L 23/467 |
| | | | | 165/166 |
| 2013/0340978 | A1 * | 12/2013 | Agostini | F28D 15/0275 |
| | | | | 165/104.21 |
| 2015/0062819 | A1 * | 3/2015 | Oughton, Jr | H05K 7/209 |
| | | | | 361/700 |
| 2015/0257307 | A1 * | 9/2015 | Mitsui | H05K 7/20418 |
| | | | | 165/185 |
| 2016/0143178 | A1 * | 5/2016 | Wang | G06F 1/183 |
| | | | | 165/80.2 |
| 2016/0262285 | A1 * | 9/2016 | Lin | H05K 7/20154 |
| 2016/0278236 | A1 * | 9/2016 | Mitsui | H01L 23/467 |
| 2016/0284622 | A1 * | 9/2016 | Mitsui | H01L 23/4006 |
| 2017/0127549 | A1 * | 5/2017 | Lunsman | H05K 7/20763 |
| 2017/0229374 | A1 * | 8/2017 | Anderl | H01L 23/4006 |
| 2018/0047885 | A1 * | 2/2018 | Hellman | H01L 33/641 |
| 2019/0194804 | A1 * | 6/2019 | Cho | H01L 21/67098 |
| 2019/0206760 | A1 * | 7/2019 | Lu | H01L 23/3736 |
| 2019/0285362 | A1 * | 9/2019 | Fushimi | F28F 3/06 |
| 2020/0084911 | A1 * | 3/2020 | Mitsui | H05K 7/20727 |
| 2020/0383232 | A1 * | 12/2020 | Gary | H01L 23/3736 |

FOREIGN PATENT DOCUMENTS

| | | | | | |
|---|---|---|---|---|---|
| CN | 101040162 | A | * | 9/2007 | F28D 15/0233 |
| CN | 202521567 | U | * | 11/2012 | |
| CN | 204129646 | U | | 1/2015 | |
| CN | 204129646 | U | * | 1/2015 | |
| CN | 204256659 | U | | 4/2015 | |
| CN | 105138098 | A | | 12/2015 | |
| CN | 105138098 | A | * | 12/2015 | |
| CN | 204994191 | U | | 1/2016 | |
| CN | 205510637 | U | | 8/2016 | |
| CN | 205510637 | U | * | 8/2016 | |
| CN | 205980537 | U | | 2/2017 | |
| CN | 205980537 | U | * | 2/2017 | |
| CN | 206790875 | U | | 12/2017 | |
| CN | 206790875 | U | * | 12/2017 | |
| CN | 108089680 | A | * | 5/2018 | |
| CN | 108271336 | A | * | 7/2018 | |
| CN | 108336048 | A | * | 7/2018 | |
| CN | 108536265 | A | * | 9/2018 | |
| CN | 108598050 | A | * | 9/2018 | |
| CN | 208888755 | U | * | 5/2019 | |
| CN | 110505791 | A | * | 11/2019 | |
| EP | 0485205 | A2 | * | 5/1992 | F28D 15/0275 |
| EP | 0623952 | A1 | * | 11/1994 | H01L 23/467 |
| EP | 0706212 | A2 | * | 4/1996 | F28F 3/025 |
| JP | 2004014608 | A | * | 1/2004 | H01L 23/3672 |
| JP | 4687706 | B2 | * | 5/2011 | |
| KR | 20070098450 | A | * | 10/2007 | H01L 23/367 |
| WO | WO-2014175975 | A1 | * | 10/2014 | H01L 23/467 |

* cited by examiner

HEAT DISSIPATION STRUCTURE AND ELECTRONIC DEVICE

CROSS-REFERENCES TO RELATED APPLICATIONS

This application claims priority of Chinese Patent Application No. 201810004320.2, filed on Jan. 3, 2018, Chinese Patent Application No. 201810042365.9, filed on Jan. 16, 2018, the entire contents of all of which are hereby incorporated by reference.

FIELD OF THE INVENTION

The present disclosure generally relates to the field of heat dissipation technologies and, more particularly, relates to a heat dissipation structure and an electronic device.

BACKGROUND

With the development of the computer industry, many application fields have put forth high requirement for the server speed. In order to meet the high requirement, a server may be configured with two or more processors.

In general, according to the present disclosure, the server can complete the computing service by using only one processor. Only when a complex computing service is to be completed, another processor or a plurality of other processors need to be called. In view of the above analysis, processors in the server usually have the situation where a single processor is overheated. In order to improve the heat dissipation efficiency of the overheated processor, the following two solutions are commonly adopted: (1) increasing the rotation speed of the entire fan system to accelerate heat dissipation, but there is an desired effect that the heat dissipation of the overheated processor is not ideal; (2) dividing the fans into a plurality of zones to separately control the fans in the plurality of zones, in order to improve the heat dissipation efficiency of the overheated processor, and only the fan corresponding to the overheated processor can be accelerated, however, there is another undesired effect that the heat dissipation of the overheated processor is slow, the single sided fan is too noisy, and the fans of other processors rotate at a constant speed, often resulting in waste of resources.

The disclosed methods and systems are directed to solve one or more problems set forth above and other problems.

BRIEF SUMMARY OF THE DISCLOSURE

One aspect of the present disclosure provides a heat dissipation structure. The heat dissipation structure includes a substrate and cooling fins connected to the substrate. The substrate includes a thermally conductive material. A first surface of the substrate has a plurality of contact regions. The plurality of contact regions of the first surface contact at least one device to be cooled.

Another aspect of the present disclosure provides an electronic device. The electronic device includes one or more devices to be cooled and one or more heat dissipation structures. Each heat dissipation structure includes a substrate comprising a thermally conductive material and has a first surface of the substrate with a plurality of contact regions. One or more cooling fins are connected to the substrate.

Another aspect of the present disclosure provides a heat dissipation method for an electronic device. The heat dissipation method includes absorbing heat generated by the heating element by a heat conductor disposed on the heating element; conducting at least part of the absorbed heat by the heat conduction connector to the thermal extension connected to the heating element based on the heat conduction connector; and dissipating heat conducted to the thermal extension by a heat sink in a region where the thermal extension is located.

Other aspects of the present disclosure can be understood by those skilled in the art in light of the description, the claims, and the drawings of the present disclosure.

BRIEF DESCRIPTION OF THE DRAWINGS

For a more complete understanding of the present disclosure and its advantages, the accompanying drawing used in the embodiments are described as follows.

DETAILED DESCRIPTION

Embodiments of the present disclosure will be described below with reference to the accompanying drawings. It should be understood, however, that the description is only illustrative, and is not intended to limit the scope of the disclosure. In addition, in the following descriptions, descriptions of well-known structures and techniques are omitted to avoid unnecessarily obscuring the concepts of the present disclosure.

The terms used herein are for the purpose of merely describing the specific embodiments, and is not intended to limit the disclosure. The terms "including", "comprising", etc., are used to indicate the presence of the features, steps, operations and/or components, but not to exclude the presence or addition of one or more other features, steps, operations or components.

All terms (including technical and scientific terms) used herein have the meaning commonly understood by those skilled in the art, unless otherwise defined. It should be noted that the terms used herein should be interpreted as having meanings consistent with the context of the specification and should not be interpreted in an idealized or too stereotypical manner.

One embodiment of the present disclosure provides a heat dissipation structure including a substrate and cooling fins connected to the substrate. The substrate comprises a thermally conductive material, and the first surface of the substrate comprises a plurality of contact regions. The plurality of contact regions are provided for contacting at least one device to be cooled.

Accordingly, the above design of the heat dissipation structure allows heat conduction between the different heat dissipation regions of the same device to be cooled by the substrate. Or different devices to be cooled conduct heat by the substrate, and heat is dissipated by the cooling fins disposed on the substrate. The temperature balance of different heat dissipation regions can be ensured in the same device to be cooled that is in contact with the substrate, or a plurality of different devices to be cooled that are connected by the substrate have a balanced temperature, to avoid the occurrence of overheating damage to the device.

The above heat dissipation structure is described below in detail. The first heat dissipation structure may include a substrate and one or more cooling fins. The substrate comprises a thermally conductive material. The first surface of the substrate comprises a plurality of contact regions. The one or more cooling fins are disposed between two contact regions of the at least one pair of adjacent contact regions on the substrate.

Figure 1A:
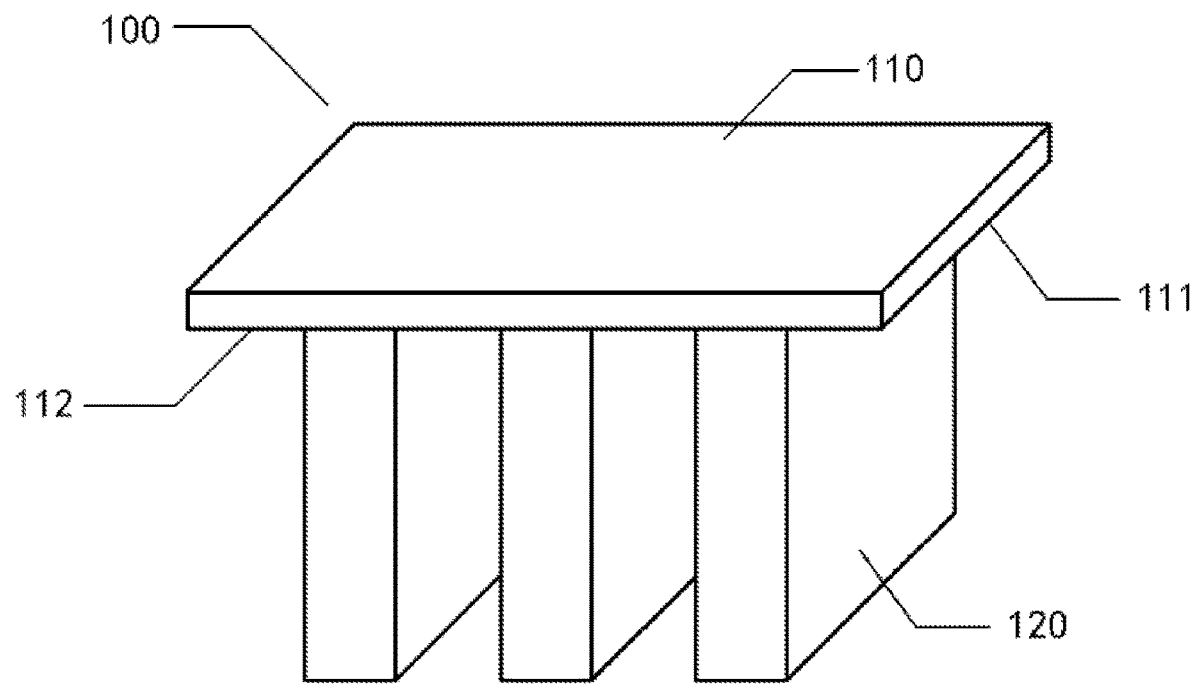
FIG. 1A-FIG. 1B illustrate structural diagrams of a first heat dissipation structure consistent with the disclosed embodiments.
Figure 1B:
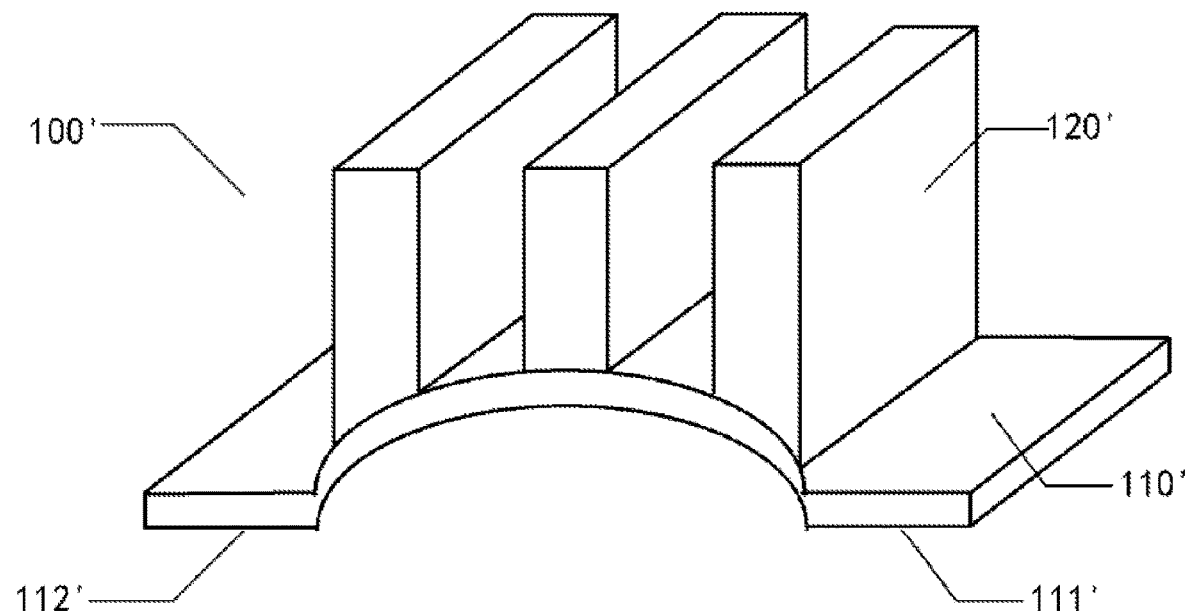

FIG. 1A-FIG. 1B illustrate two structural diagrams of a first heat dissipation structure consistent with the disclosed embodiments. It should be noted that FIG. 1A and FIG. 1B are only examples of two structures that can be used as the heat dissipation structures in one embodiment, to help those skilled in the art understand the technical content of the present disclosure. It does not mean that other structures may not be adopted as heat dissipation structures.

As shown in FIG. 1A, the heat dissipation structure 100 includes a substrate 110 and three cooling fins 120. The substrate 110 includes a thermally conductive material. The thermally conductive material may include a metal material such as gold, silver, copper, alloy, etc., and may also include a non-metal materials such as graphene, graphite, carbon fiber, and C/C composite material.

As shown in FIG. 1A, the first surface of the substrate 110 includes two contact regions 111 and 112. In the heat dissipation structure 10, the two contact regions 111 and 112 can respectively contact two devices to be cooled. Specifically, as shown in FIG. 1A, two devices to be cooled are adhered to the first surface of the substrate 110. The first surface is the lower surface in FIG. 1A. Even if the temperatures of the two devices to be cooled are different, the two devices can conduct heat by the substrate 110 in contact with the two devices to maintain a relatively balanced temperature during the heat dissipation process. Accordingly, the situation that the life of the overheated device is shortened or even the overheated device is damaged is avoided.

Accordingly, the shape of the above substrate is not limited to cuboid shown in FIG. 1A. The shape may be a convex structure, or a concave structure. Or the shape may be a columnar structure or the like in other areas other than the contact regions. The shape of contact regions may match the regions in contact with the device to be cooled to ensure that the contact regions can be closely fitted to the heat device to be cooled.

As shown in FIG. 1A, the heat dissipation structure 10 further includes three cooling fins 120 disposed between two contact regions of the at least one pair of adjacent contact regions on the substrate. That is, three cooling fins 120 are located between zone 111 and zone 112 in FIG. 1A. In FIG. 1A, the three cooling fins 120 are disposed on the first surface of the substrate 110. However, the position of the cooling fins 120 relative to the substrate 110 are not limited. For example, the cooling fins 120 may also be disposed on the second surface of the substrate opposite to the first surface. The second surface of the substrate is the upper surface of the substrate 110 in FIG. 1A.

Through the disposition of the cooling fins 120, the heat on the substrate can be transferred to the cooling fins 120 in time. Since the cooling fins 120 have a larger surface area, the heat dissipation area can be effectively increased to promote rapid heat dissipation of the device to be cooled. Moreover, the heat can be quickly transferred between two devices to be cooled so that the temperature gradient is reduced more quickly, and the situation that the life of the overheated device is shortened or even the overheated device is damaged is avoided.

The above-mentioned devices to be cooled may include a processor, a large and medium power transistor, a field effect transistor, a voltage regulator tube with a large output current, and the like, which requires heat dissipation.

As shown in FIG. 1B, in one embodiment, a heat dissipation structure 100 includes a substrate 110 and three cooling fins 120. The substrate 110 includes a thermally conductive material. The thermally conductive material may include a metal material such as gold, silver, copper, alloy, etc., and may also include a non-metal materials such as graphene, graphite, carbon fiber, and C/C composite material.

As shown in FIG. 1B, the first surface of the substrate 110 includes two contact regions 111 and 112. In the heat dissipation structure 10, the two contact regions 111 and 112 can respectively contact two different heat dissipation regions of one device to be cooled. Specifically, as shown in FIG. 1A, different heat dissipation regions of the device to be cooled are adhered to the first surface of the substrate 110. The first surface is the lower surface in FIG. 1A. Even in the case that the heat generation of the two different heat dissipation regions of the device to be cooled is uneven so that there is a temperature gradient between the two different heat dissipation regions, by the substrate 110 in contact with the two different heat dissipation regions, the two different heat dissipation regions can conduct heat. The temperature gradient between the two regions is reduced to improve the performance of the device to be cooled. The damage to the device caused by the overheating in partial areas of the device to be cooled can be avoided.

Accordingly, the shape of the substrate in reference to FIG. 1B is not limited by the illustrated structure. The specific structure thereof may be matched with the device to be cooled. That is, the contact region may be shaped to ensure a close fit to different heat dissipation regions of the device to be cooled. The shape design of the non-contact regions is relatively free, and the non-contact regions can be in contact with or not in contact with the device to be cooled.

As shown in FIG. 1B, the heat dissipation structure 100 further includes three cooling fins 120 disposed between two contact regions of a pair of adjacent contact regions on the substrate. That is, the three cooling fins 20 are located between adjacent zone 111 and zone 112. In FIG. 1B, the three cooling fins 120 are disposed on a second surface of the substrate 110' opposite to the first surface, but the disposed position of the cooling fins 120 relative to the substrate 110 is not limited herein. The disposed position of the cooling fins 120 can be specifically set according to the structure of the device to be cooled. For example, when the device to be cooled is in a concave shape, the cooling fin 120 may be disposed on the first surface of the substrate, which is the lower surface of the substrate 110 in FIG. 1B.

Through the disposition of the cooling fins 120, the heat on the substrate can be transferred to the cooling fins 120 in time. Since the cooling fins 120 have a larger surface area, the heat dissipation area can be effectively increased to promote rapid heat dissipation of the device to be cooled. Moreover, the heat can be quickly transferred between two devices to be cooled so that the temperature gradient is reduced more quickly, and the situation that the overheated device is damaged is avoided.

The above-mentioned devices to be cooled may include a processor, a large and medium power transistor, a field effect transistor, a voltage regulator tube with a large output current, and the like.

It should be understood that contact regions, and/or the number of cooling fins in FIGS. 1A and 1B or the number and the type of devices to be cooled described above are merely illustrative. The distribution of cooling fins and the contact regions are also merely illustrative. For example, the connection of a plurality of contact regions may encompass to be a quadrangular shape, a round shape, or the like. In fact, any number and any distribution of contact regions and cooling fins can be disposed according to the number and the type of the devices to be cooled.

Figure 2A:
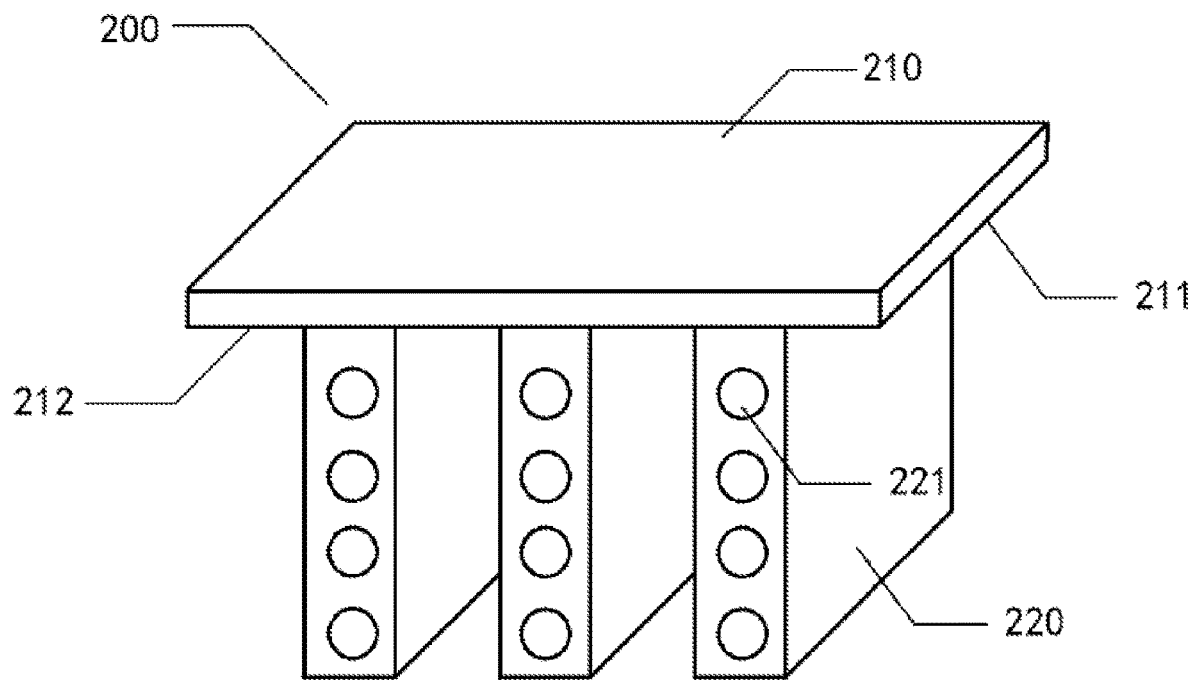
FIG. 2A-FIG. 2C illustrate structural diagrams of another first heat dissipation structure consistent with the disclosed embodiments.
Figure 2B:
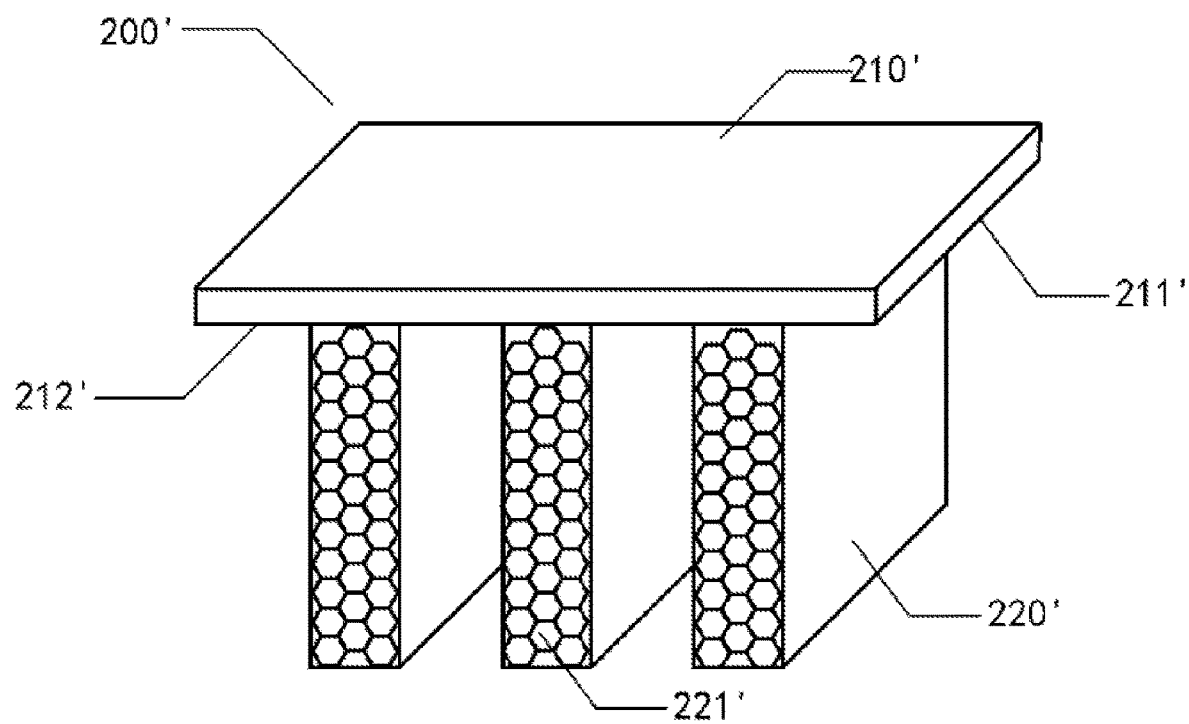
Figure 2C:
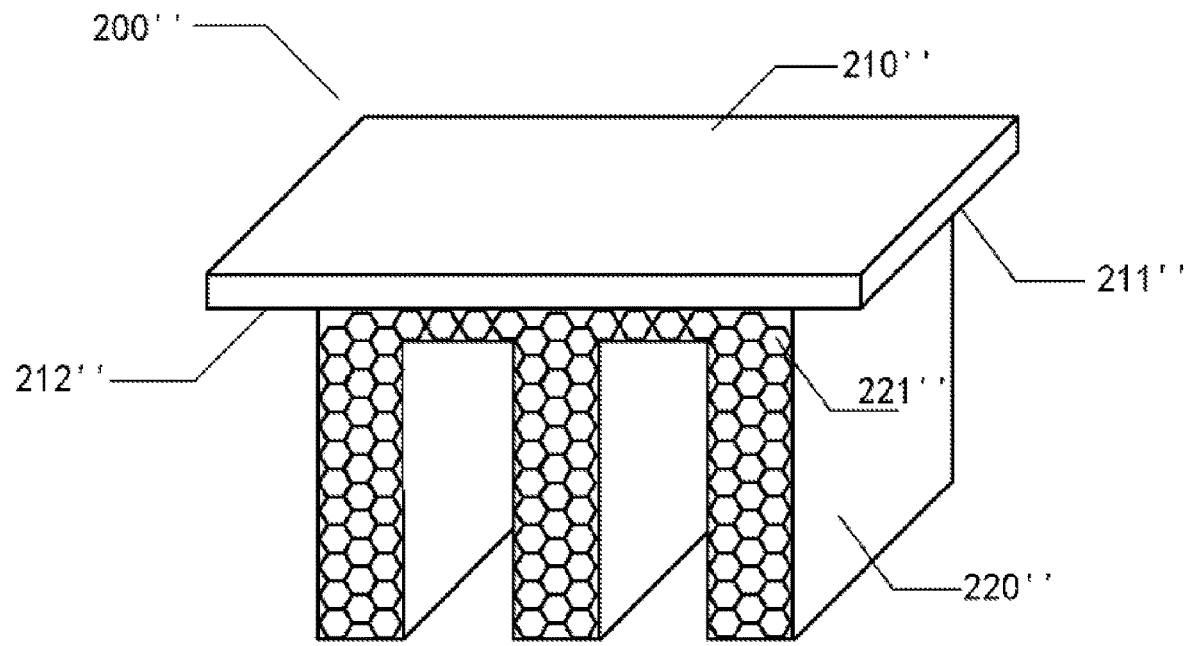

FIG. 2A~FIG. 2C illustrate structural diagrams of another first heat dissipation structure consistent with the disclosed embodiments. As shown in FIG. 2A, the heat dissipation structure 200, similar to the heat dissipation structure illustrated in FIG. 1A~FIG. 1B, includes a substrate 210 and cooling fins 220.

The substrate 210 includes a plurality of contact regions 211, and one or more cooling fins 220 are disposed between two of the at least one pair of adjacent contact regions 211.

As shown in FIG. 2A, at least one of the cooling fins 220 includes one or more through holes 221. Through the disposition of the through holes 221, the heat dissipation area of the cooling fins 220 can be further increased to improve the heat dissipation efficiency of the heat dissipation structure.

The shape of the through holes 221 may include any one or more of the following: a circle, a square, a rectangle, a triangle, a trapezoid, a honeycomb. The shapes of the through holes are not limited herein. According to actual needs, those skilled in the art can set the through hole to an arbitrary shape in order to improve the heat dissipation efficiency. For example, as shown in FIG. 2B, the shape of the through holes 221 can be set to a closely arranged honeycomb shape to fully utilize the surface area of the cooling fins, increase the heat dissipation area, and improve the heat dissipation efficiency.

In one embodiment, at least one of the through holes penetrates two opposite surfaces of the cooling fins and does not contact the substrate. For example, the through holes may penetrate the front and rear surfaces of the cooling fins, or the left and right surfaces of the cooling fins in FIG. 2A or FIG. 2B, as long as the through holes on the cooling fins do not contact the substrate. In practical applications, those skilled in the art can set the opening direction of the through holes and the angle of the through holes with respect to the plane according to actual needs. For example, when the heat dissipation structure is applied to the heat dissipation of a processor CPU in a server, if the server is cooled by air cooling, and the air direction is the front and rear direction of the server, the direction of the through holes may be set along the front and rear direction of the server.

In one embodiment, at least one extension direction of the through holes is perpendicular to the line connecting the respective geometric centers of the two contact regions. As shown in FIG. 2A or FIG. 2B, the extension direction of the through holes is the front and rear direction in the figures, and the connecting line of the geometric center of the two contact regions of the substrate is in the left and right direction in the figures, so the extension direction of the through holes is perpendicular to the line connecting the geometric centers of the two contact regions. The arrangement ensures that the through holes do not contact the substrate. It can be understood that the specific extension direction of the through holes is not limited herein. Those skilled in the art can rationally design the extension direction of the through holes according to actual needs, so as to improve the heat dissipation efficiency of the device to be cooled.

In one embodiment, in an application scenario of cooling the device to be cooled by air cooling, by properly designing the through holes of the cooling fins and the extension direction, distribution and shape of the through hole according to the above description, the situation that the cooling fins block the air flow can be avoided. Since the air flows through the through hole of the cooling fins, the contact area between the air flow and the cooling fins is increased, the air can effectively take away the heat absorbed by the heat dissipation structure in time, thereby effectively improving the heat dissipation efficiency of the device to be cooled.

In one embodiment, as shown in FIG. 2C, at least two cooling fins 220 are in partial contact with each other so that at least two cooling fins can not only conduct heat through the substrate, but also directly conduct heat between the two fins to promote the even temperature distribution of the entire heat dissipation structure. The following situation can be avoided: in the heat dissipation structure, the temperature of the cooling fins close to the device to be cooled is high, and due to the limited heat dissipation capacity of the cooling fins, part of the heat is accumulated, which is not conducive to the timely heat diffusion of the device to be cooled.

As shown in FIG. 2C, a region where the at least two cooling fins are in partial contact with each other may also be provided with a plurality of through holes 221 in order to further increase the heat dissipation surface area and improve heat dissipation efficiency In one embodiment, as shown in FIG. 2A-FIG. 2B, there is a space between the at least two cooling fins, and the space can be used for placing another device to be cooled. For the device to be cooled by air cooling, another device to be cooled in the space area can be further cooled by the air flow. For example, in the server, if the device to be cooled is a processor CPU, the other device to be cooled may be hardware such as a memory, a hard disk, a network card, or the like. The size of the space can be set according to actual needs. If the height of the other device to be cooled is lower than the height of the cooling fins, partial contact and partial spacing between at least two cooling fins can be considered to increase heat dissipation region as much as possible and improve the heat dissipation efficiency.

It should be noted that, FIG. 2A-FIG. 2C only illustrate that the structure in FIG. 1A is provided with through holes. The cooling fins of the structure in FIG. 1B can also be provided with through hole similar to the through holes 221 shown in FIG. 2A or similar to the through holes 221 in FIG. 2B. Similar to FIG. 2C, the two cooling fins of at least one pair of adjacent fins of the structure in FIG. 1B may also be partially contacted or provided with a space.

Figure 3A:
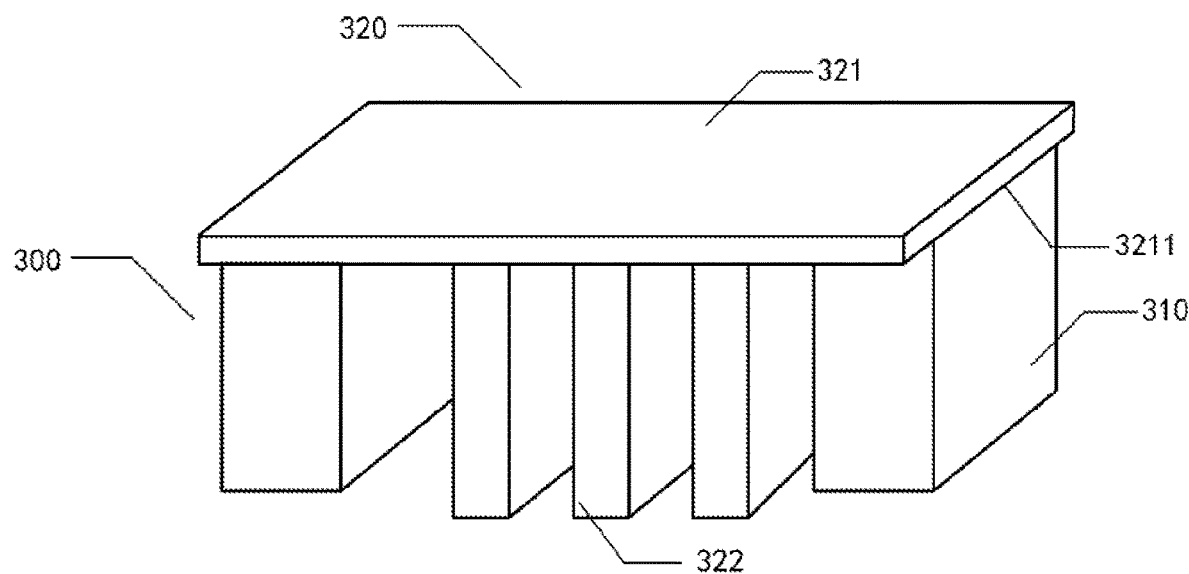
FIG. 3A-FIG. 3B illustrate structural diagrams of an electronic device consistent with the disclosed embodiments.
Figure 3B:
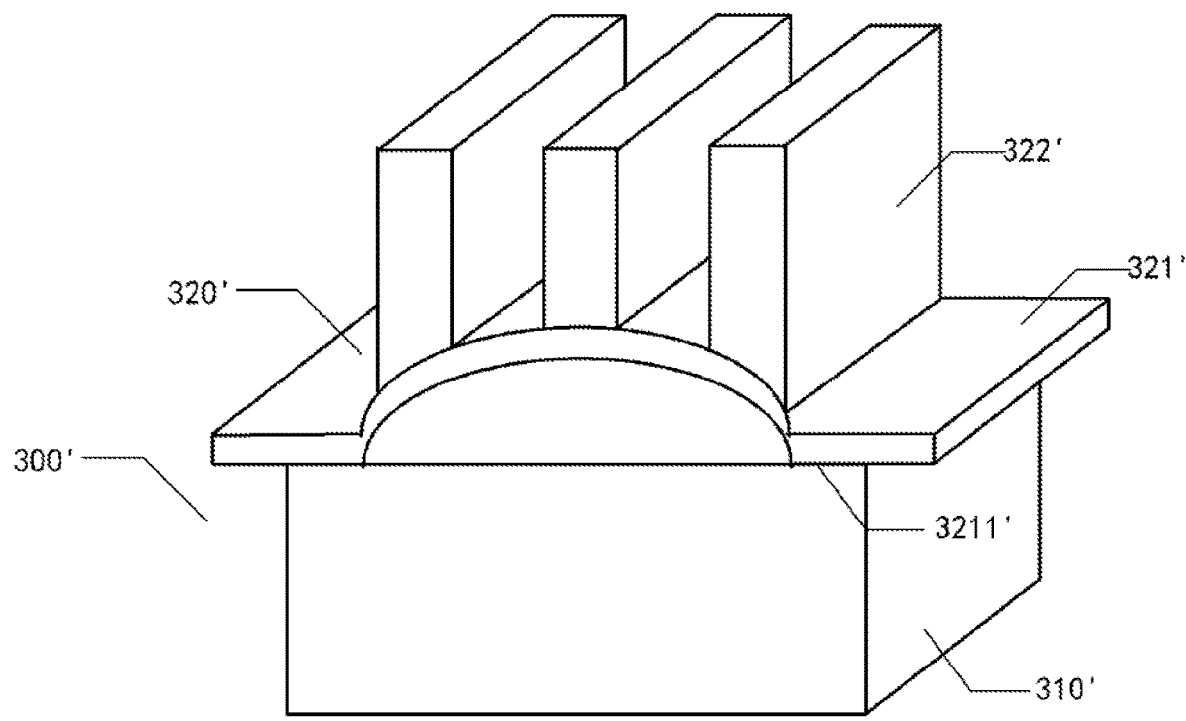

FIG. 3A-FIG. 3B illustrate structural diagrams of an electronic device consistent with the disclosed embodiments. As shown in FIG. 3A, the electronic device 300 includes one or more devices to be cooled 310, and one or more heat dissipation structures 320. The device to be cooled 310 includes one or more electronic devices. The electronic device may include a processor CPU, a heat sink used with the processor CPU, a hard disk, a memory, a power source, and the like.

At least one heat dissipation structure 320 includes a substrate 321 and one or more cooling fins 322. The first surface of the substrate 321 includes a plurality of contact regions 3211. The cooling fins 322 are disposed between the two contact regions 3211 of at least one pair of adjacent contact regions on the substrate 321. The plurality of contact regions 3211 of the at least one heat dissipation structure 320 can be in close contact with the at least one device to be cooled 320. For example, the at least one heat dissipation structure 320 may adopt the heat dissipation structure shown in FIG. 1A to FIG. 2C.

In one embodiment, the heat of the device to be cooled can be taken away in time by the heat sink that is in contact with the device to be cooled, thereby improving the heat dissipation efficiency of the device to be cooled, and avoiding the device damage caused by excessive temperature because of low heat dissipation efficiency in some devices to be cooled.

In one embodiment, as shown in FIG. 3A, a plurality of contact regions 3211 of at least one heat dissipation structure 320 are in contact with upper surfaces of two different electronic devices to enable heat conduction between different electronic devices by the heat dissipation structure, thereby balancing temperature difference of electronic devices, and avoiding the device damage caused by the overheating of a single electronic device.

In one embodiment, as shown in FIG. 3B, a plurality of contact regions 3211 of the at least one heat dissipation structure 320 may also be in contact with different regions of the upper surface of the same electronic device 310. Different regions of the same electronic device conduct heat by the heat dissipation structure 320 to balance the temperatures of different regions of the same electronic device, and avoid the device damage caused by excessive local temperature of the electronic device.

Figure 4A:
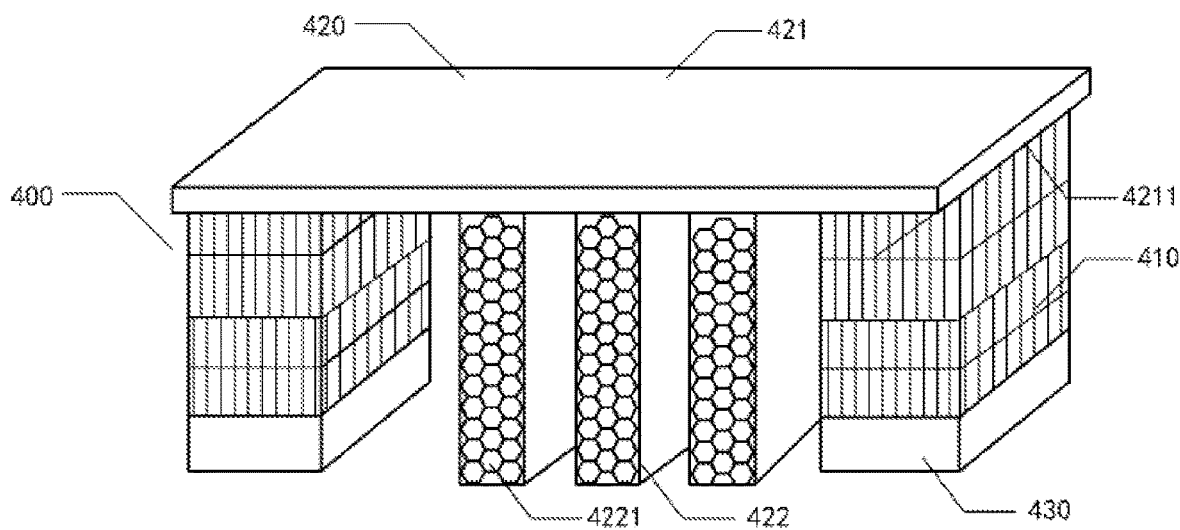
FIG. 4A-FIG. 4B illustrate structural diagrams of another electronic device consistent with the disclosed embodiments.
Figure 4B:
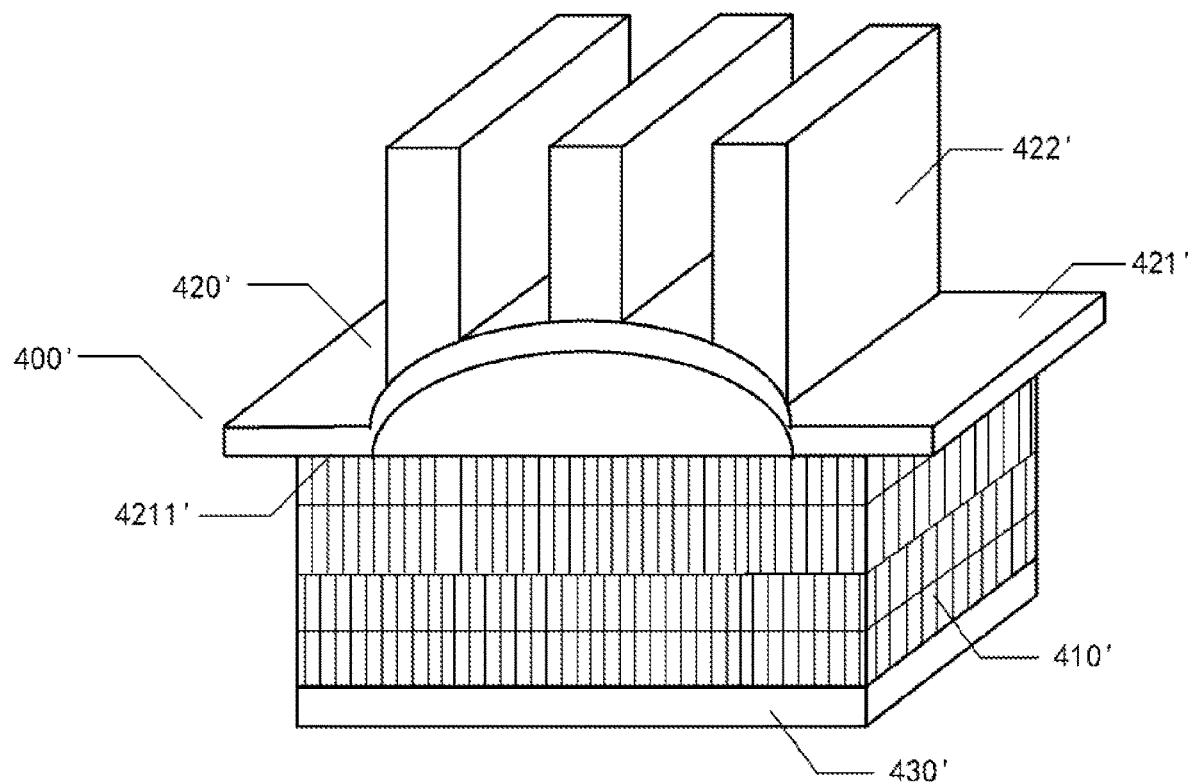

FIG. 4A to FIG. 4B illustrate structural diagrams of another electronic device consistent with the disclosed embodiments. As shown in FIG. 4A and FIG. 4B, the electronic device 400 includes one or more devices to be cooled, one or more heat dissipation structures 420, and one or more electronic devices 430. The device to be cooled includes one or more heat sinks 410, and at least one heat sink 410 is disposed on the upper surface of the at least one electronic device 430 for heat dissipation of at least one electronic device 430.

As shown in FIG. 4A, the heat dissipation structure 420 includes a substrate 421 and a plurality of cooling fins 422. The first surface of the substrate 421 has a plurality of contact regions 4211. Specifically, the heat dissipation structure 420 may adopt the heat dissipation structure 200 in FIG. 2A-FIG. 2C or the heat dissipation structure 320 in FIG. 3A.

The plurality of contact regions 4211 of the substrate 421 in the heat dissipation structure 420 are in contact with the upper surfaces of the different heat sinks 410, so that the different heat sink 410 conducts heat by the heat dissipation structure 420, and ensure the temperature balance between the plurality of heat sinks 410, thereby indirectly balancing the temperatures of the plurality of electronic devices 430.

In practice, if the server is cooled by air cooling, each processor CPU may be provided with a fan. For a server with two or more processor CPUs, in the normal working mode, only one CPU is called to complete the corresponding work while the other processor CPUs are idle. As a result, the CPU temperature of the called processor is too high while the CPU temperature of other processors is close to normal temperature. In order to reduce the temperature of the CPU of the called processor, all the allocated fans are accelerated, which inevitably leads to waste of resources due to the accelerated rotation of the fans corresponding to other processors. If each fan is separately controlled, only the fan corresponding to the CPU of the called processor is accelerated while the fans corresponding to the other processor CPUs work normally. Then there is a defect that the cooling speed of the CPU of the called processor is slow and the single sided fan is too noisy in the server.

In one embodiment, the electronic devices 430 in FIG. 4A are two processor CPUs in the server. The heat sinks 410 include two heat sinks for respectively dissipating heat from the two processor CPUs. The two heat sinks 410 can conduct heat by the heat dissipation structure 420 in FIG. 4A, so that the two processor CPUs can conduct heat by the two heat sinks 410 and the heat dissipation structure 420. The overheated processor CPU can diffuse part of the heat by the heat dissipation structure 420 and a fan corresponding to another processor CPU. The resource waste is avoided and the heat dissipation efficiency of the overheated processor CPU is improved.

In one embodiment, the cooling fins 422 of the heat dissipation structure 420 in FIG. 4A may also be provided with a plurality of through holes 4221 to increase the heat dissipation surface area of the heat dissipation structure 420, prevent the block of the air flow driven by the fan, and increase the contact area between the air flow and heat dissipation structure 420. Accordingly, when the air flows through the plurality of through holes of the cooling fins, the heat of the cooling fins is taken away in time, and improve the heat dissipation efficiency of the server. The plurality of through holes maybe the plurality of closely disposed honeycomb-shaped through holes. The surface area of the cooling fins can be fully utilized, the heat dissipation surface area can be improved as much as possible, and the heat dissipation efficiency is further improved.

Figure 5:
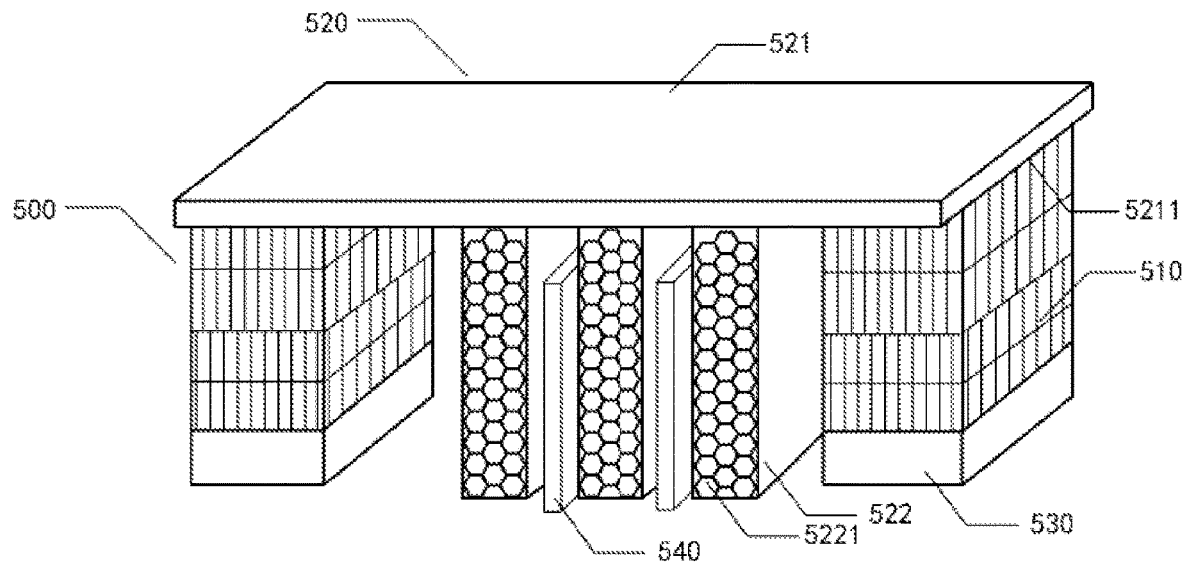
FIG. 5 illustrates a structural diagram of another electronic device consistent with the disclosed embodiments.

FIG. 5 illustrates a structural diagram of yet another electronic device consistent with the disclosed embodiments. In one embodiment, as shown in FIG. 5, the electronic device is similar to the electronic device in FIG. 4A except that the electronic device in FIG. 5 further includes at least one other device 540 other than the device to be cooled 510.

When the device to be cooled 510 is a heat sink used in the server with the processor CPU, the at least one other device 540 may include a memory, a hard disk, a power source, and the like. A memory is used as an example herein.

There is a space between two of the at least one pair of adjacent cooling fins of the cooling fins 522 of the heat dissipation structure 520. The at least one other device can be placed in the space. In one embodiment, as shown in FIG. 5, there are three cooling fins and each of the two adjacent cooling fins is provided with a space. The electronic device can be disposed with at least two other devices 540 (for example, a memory). The memory is disposed in a staggered manner with the cooling fins. In the server, the memory and processor CPU are both fixed on the circuit board.

In one embodiment, through above settings, the electronic device can fully utilize the internal space of the electronic device, and can dissipate heat to other devices that need to dissipate heat by air flow, thereby improving energy utilization.

It can be understood that the number of cooling fins of the heat dissipation structure in the electronic device and the number of other devices are not limited herein. The structure in FIG. 5 is only used to help understanding the embodiments. Those skilled in the art can set the number of the cooling fins and other devices according to actual needs, as long as the spaces between the cooling fins can be ensured, and the number of the spaces is not less than the number of other devices, and the width of the spaces is greater than that of other devices.

Figure 6:
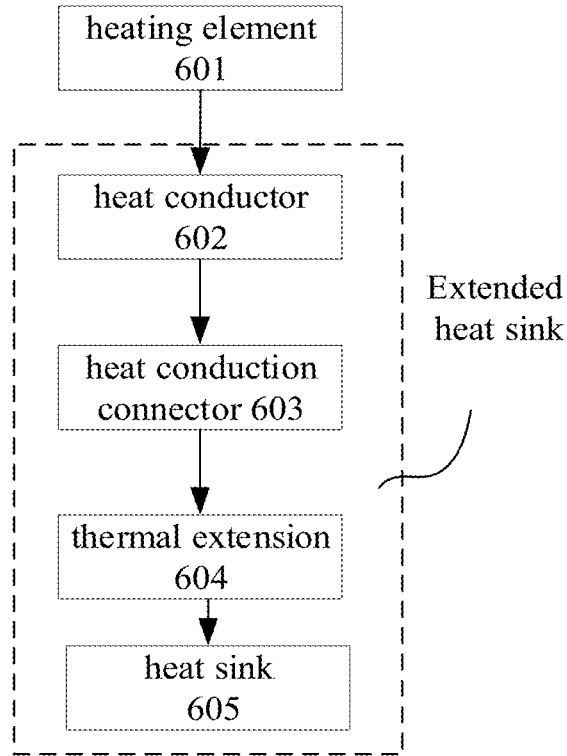
FIG. 6 illustrates a structural diagram of a second heat dissipation structure consistent with the disclosed embodiments.

A second heat dissipation structure is shown in FIG. 6. The substrate is a heat conductor 602. The heat dissipation structure also includes a heat conduction connector 603 and a thermal extension 604. The heat dissipation structure further includes a heating element 601 and a heat sink 605.

Optionally, in one embodiment, the second heat dissipation structure may be mainly applied to the rack server. The rack server adopts a fan/wall sharing design, and a RMC (Rack Management Controller) or a rack backplane (RBP, Rack Back Plane) can control fans independently. Thus, such design allows for independent maintenance on server nodes and transparency to server nodes.

Optionally, the heating element 601 can be disposed on a chassis of the server nodes, specifically, CPUs located on the chassis. The heat conductor 602 is disposed on the heating element 601, and the heat conductor 602 absorbs heat generated by the heating element 601. Optionally, the heat conductor 602 may be a heat sink on the CPU.

The thermal extension 604 is connected to the heat conductor 602 by the heat conduction connector 603. By the heat conduction connector 603, at least part of the heat absorbed by the heat conductor 602 is conducted to the thermal extension 604. Optionally, the thermal extension 604 may be an elastic thermally conductive material or an extended heat sink.

The heat sink 605 is located in the region where the thermal extension 604 is located. The heat conducted to the thermal extension 604 is dissipated by the heat sink 605. Optionally, the heat sink may be a fan. The heat sink 605 in the region where the thermal extension 604 is located is disposed corresponding to the heat sink 605 in the region where the heating element 601 is located. The heat generated by the heating element is absorbed by the heat conductor 602, and the heat absorbed by the heat conductor is diffused by the thermal extension 604. As a result, the heat conduction area is increased, so that the heat sink can effectively improve the heat dissipation effect on the heating element and reduce the energy consumption.

In one embodiment, the device to be cooled may be a rack server. When the heat conduction connector 603 and the heating element 601 are in the same plane, by the heat conduction connector 603, at least part of the absorbed heat is conducted to the thermal extension connected to the heating element 601 based on the heat conduction connector 603. The thermal extension 604 and the heating element 601 are located in different planes.

In another embodiment, when the heat conduction connector 603 and the heating element 601 are in the same plane, by the heat conduction connector 603, at least part of the absorbed heat is transferred to the thermal extension connected to the heating element 601 based on the heat conduction connector 603. The thermal extension 604 and the heating element 601 are located in the same plane.

In another embodiment, when the heat conduction connector 603 and the heating element 601 are in different planes, by the heat conduction connector 603, at least part of the absorbed heat is transferred to the thermal extension connected to the heating element 601 based on the heat conduction connector 603. The thermal extension 604 and the heating element 601 are located in the same plane.

In another embodiment, when the heat conduction connector 603 and the heating element 601 are in different planes, by the heat conduction connector 603, at least part of the absorbed heat is transferred to the thermal extension connected to the heating element 601 based on the heat conduction connector 603. The thermal extension 604 and the heating element 601 are located in different planes.

The solution of using the chassis of the upper server nodes to dissipate heat by transferring the heat generated by the CPU to the chassis of the server node above the current server nodes, and the solution of dispersing the heat generated by the CPU to the air duct in the area where the extended heat sink is located by extending the heat dissipation on the CPU, instead of concentrating the heat on the air duct facing the CPU, can improve the heat dissipation speed for the CPU and reduce the power consumption when the fans dissipate heat.

Figure 7:
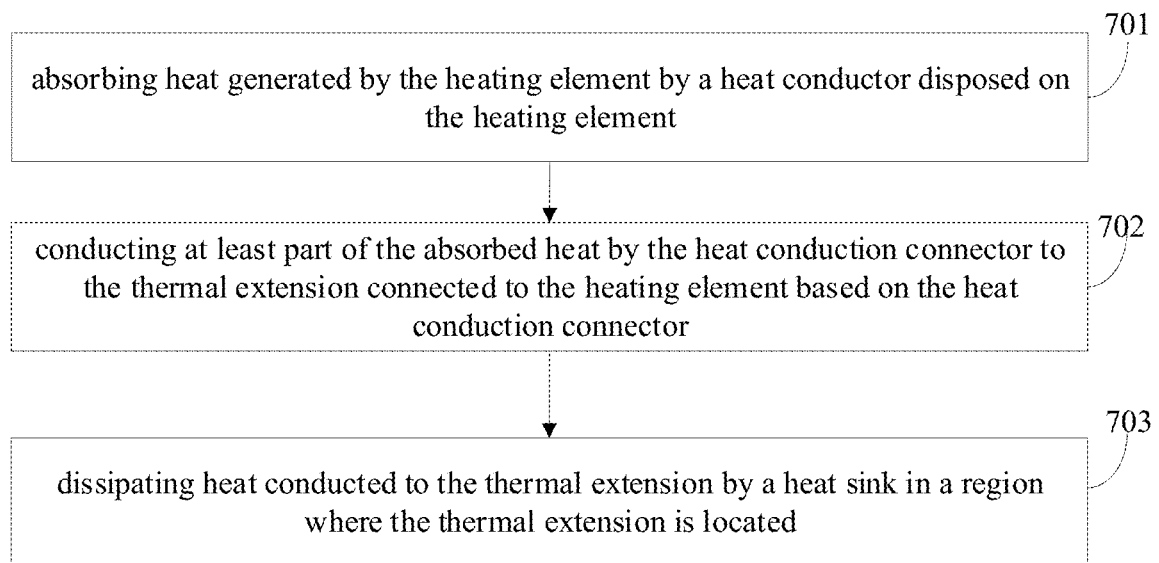
FIG. 7 illustrates a flowchart of a heat dissipation method consistent with the disclosed embodiments.

For the second heat dissipation structure, a heat dissipation method is provided in one embodiment. FIG. 7 illustrate a flowchart of the heat dissipation method consistent with the disclosed embodiments. The method includes the followings.

S701: absorbing heat generated by the heating element by a heat conductor disposed on the heating element.

In one embodiment, the method is mainly applied to a rack server. The rack server adopts a fan/wall sharing design, and a rack management controller (RMC) or a rack back plane (RBP) can control fans independently. The design allows for independent maintenance on server nodes and transparency to server nodes.

The RMC is usually placed in the power supply frame of the rack (also called the power module) and fixed on one side of the power supply frame. The RBP is placed on the rear side of the rack. The RBP is close to the fan tray to cover server nodes in the rack.

Specifically, the RBP can be connected to the back plane by a connector. The RBP can also be connected to the tray back plane by a PCIE X1 connector. The RBP can also be connected to the RMC by a 7Pin connector. The RBP can also communicate with the fan tray by a cable. The RBP can be designed as a whole or in a split to require seamless interface with server nodes. The mechanical design of the RBP can also match the actual deployment position of the server, and adjust the position up and down in U units.

In one embodiment, if the rack server is a Scorpio RACK server, and a fan tray with a set of three fans numbered I, II, III are used to dissipate four server nodes in the rack server. The central processing unit (CPU) in each server node is the main heat dissipation object. The fan trays are fixed to the rear of the rack in units of 4 U, and the position can be adjusted up and down in unit of 1 U. Each fan tray contains three fan boxes and a fan back plane. The fan back plane takes power from the rack for the fan to operate. The fan trays can not only cover the space of the 4 U nodes for heat dissipation, but also can cover more U nodes for heat dissipation.

When the fan tray only covers a 4 U node space for heat dissipation, it needs to isolate the heat dissipation space by increasing partitions for isolation. When the fan tray covers more U nodes, it needs to dissipate heat for the shared cooling space.

In one embodiment, the heating element may be a CPU in the server nodes, and the heat conductor may be a heat sink covering the CPU. Specifically, in the Scorpio RACK server, the CPUs are the main heat dissipation objects. Usually the heat sink covering the surface of the CPU absorbs the heat generated by the CPU. By the fans in the areas where current CPUs are located, heat is outputted to achieve the heat dissipation effect for the CPUs. The details are shown in FIG. 8.

Figure 8:
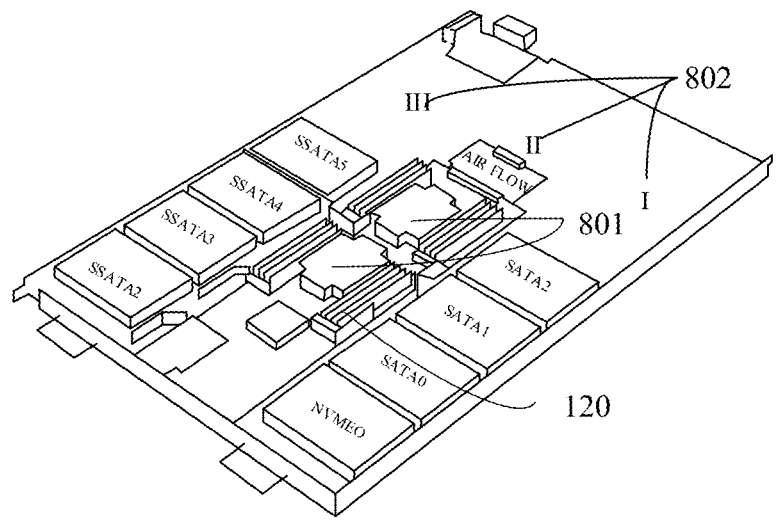
FIG. 8 illustrates a structural diagram of server nodes.

FIG. 8 illustrates a structural diagram of server nodes. As shown in FIG. 8, the structure includes one dual CPU 801 and three fans 802 numbered I, II, and III respectively. The air duct II is directly opposite to the CPU. The other two air ducts I and III are located on the two sides of the air duct II respectively.

The heat generated by the two CPUs 801 is absorbed by the heat sink covering the upper surface thereof, and at least part of the absorbed heat is dissipated by the three fans 802.

However, when the temperature of the CPU 801 rises, the fan speed of the three fans is generally increased, and the power consumption thereof is also increased. Among the three fans, since the middle fan II faces the air outlet of the CPU 801, the temperature of the fan II is significantly higher than the temperatures of fan II and fan III. Thus the three fans cannot evenly dissipate heat from the CPU.

Table 1 below shows one experimental result of the cooling effects of three fans for the CPU.

TABLE 1

| | CT | | | | |
|---|---|---|---|---|---|
| | 30 C. | 30 C. | 30 C. Press | 30 C. | 30 C. |
| | IDLE @ RMC | PTU @ RMC | Yes + dd @ RMC | Yes @ RMC | dd @ RMC |
| I | 33.9 | 36.2 | 36.6 | 36.4 | 36.2 |
| II | 44.3 | 58.4 | 54.9 | 56.9 | 50.2 |
| III | 34.1 | 34.8 | 35.1 | 35.0 | 35.8 |

In Table 1, for the same server nodes under five different pressures models, the temperature differences between three air ducts with common structure are large. The minimum temperature difference is 10.2° C. and the maximum temperature difference is 23.6° C. The temperatures of the air duct II facing the CPU are highest in all the tests under five different pressures. Therefore, the existing solution cannot effectively utilize the three air ducts to effectively and uniformly dissipate heat for the CPU.

Table 2 below shows another experimental result of the cooling effects of three fans for the CPU.

TABLE 2

| | CT | | | | |
|---|---|---|---|---|---|
| | 30 C. | 30 C. | 30 C. Press | 30 C. | 30 C. |
| | IDLE @ RMC | PTU @ RMC | Yes + dd @ RMC | Yes @ RMC | dd @ RMC |
| I | 33.9 | 36.2 | 36.6 | 36.4 | 36.2 |
| II | 44.3 | 58.4 | 54.9 | 56.9 | 50.2 |
| III | 34.1 | 34.8 | 35.1 | 35.0 | 35.8 |
| Fan speed | 3137.0 | 3998.0 | 3755.0 | 3868.0 | 3513.0 |
| Fan power | 8.7 | 15.6 | 13.9 | 14.3 | 11.6 |

As shown in Table 2, for the same server nodes under five different pressures models, the temperature differences between three air ducts are large. The minimum temperature difference is 10.2° C. and the maximum temperature difference is 23.6° C. The temperatures of the air duct II facing the CPU are highest in all the tests under five different pressures. The fan speed and fan power are proportional to the temperature. Therefore, the existing solution cannot effectively utilize the three air ducts to effectively and uniformly dissipate heat for the CPU.

S702: conducting at least part of the absorbed heat by the heat conduction connector to the thermal extension connected to the heating element based on the heat conduction connector.

In one embodiment, when the heat conduction connector and the heating element are in the same plane, by the heat conduction connector, at least part of the absorbed heat is transferred to the thermal extension connected to the heating element based on the heat conduction connector, and the thermal extension and the heating element are in different planes. In another embodiment, when the heat conduction connector and the heating element are in the same plane, by the heat conduction connector, at least part of the absorbed heat is transferred to the thermal extension connected to the heating element based on the heat conduction connector, and the thermal extension and the heating element are in the same plane. In another embodiment, when the heat conduction connector and the heating element are in different planes, by the heat conduction connector, at least part of the absorbed heat is transferred to the thermal extension connected to the heating element based on the heat conduction connector, and the thermal extension and the heating element are in the same plane. In another embodiment, when the heat conduction connector and the heating element are in different planes, by the heat conduction connector, at least part of the absorbed heat is transferred to the thermal extension connected to the heating element based on the heat conduction connector, and the thermal extension and the heating element are in different planes. Specifically, the setting structure of heat conduction connector, thermal extension and heating element is not limited, as long as by the heat conduction connector at least part of the heat absorbed by the heat conductor is conducted to the thermal extension.

In one implementation, the heat conduction connector and the thermal extension may be integrally disposed with the heat conductor. The heat conduction connector and the thermal extension both serve as extended portions of the heat conductor, and are filled in a blank area of the chassis of the server nodes. The heat conduction connector and the thermal extension are disposed at the air duct opening in the area where the heating element is located, so that the airflow from the fan in the area where the heating element is located passes through the extended heat sink formed by the heat conductor, the heat conduction connector and the thermal extension, to achieve the purpose of quickly and effectively dissipating the thermal effect brought by the high CPU performance. Specifically, the structure for effectively dissipating heat generated by the heating element by the extended heat sink is shown in FIG. 9.

Figure 9:
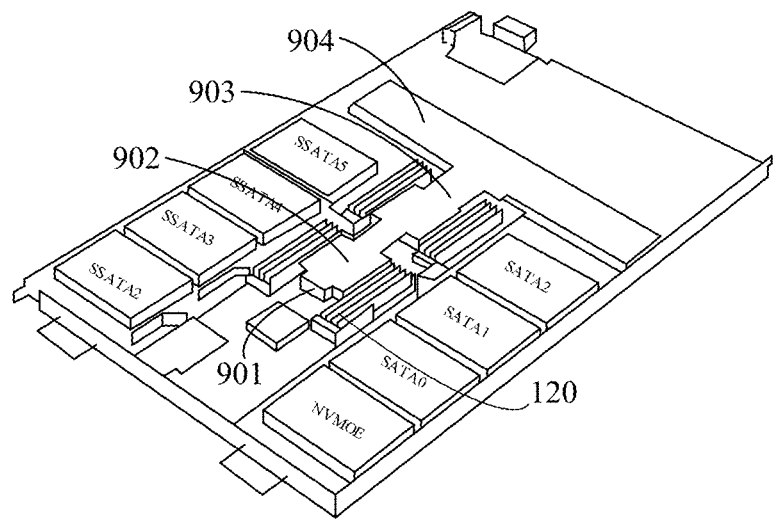
FIG. 9 illustrates a structural diagram of heat dissipation for CPU heat consistent with the disclosed embodiments.

FIG. 9 illustrates a structural diagram of heat dissipation for CPU heat consistent with the disclosed embodiments. As shown in FIG. 9, the structure includes a heating element (CPU) 901, a heat conductor (heat sink) 902, a heat conduction connector 903, and a thermal extension 904. The heat conduction connector 903 and the thermal extension 904 may be integrally disposed with the heat conductor 902 to form an extending heat sink. The extended heat sink covers the heating element 901, and the extended heat sink is disposed in the same plane as the heating element 901 to cover the blank area of server nodes.

Specifically, through the heat conduction connector 903, the thermal extensions 904 extends from one end of the heat conductor 902 to the air duct openings of the three fans in the region where the heating element 901 is located to fill the blank area of the chassis of the server nodes. The thermal extensions 904 are disposed at the three air conduct openings. When the heat conductor 902 conducts the absorbed heat to the thermal extension 904 (extended heat sink) by the heat conduction connector 903, the heat absorbed by the heat conductor 902 is first evacuated. When the heat is evacuated to the three air duct openings, the heat conducted by the thermal extension 904 is further evacuated by three fans on the three air duct openings, so that the heat generated by the high CPU performance is dispersed in the nine air ducts instead of being concentrated on the air conduct II facing the CPU. The heat dissipation structure can effectively achieve the rapid evacuation of the thermal effect brought by high CPU performance.

The cooling effect of the fan for the CPU is shown in Table 3 by the solution of the extended heat sink provided herein.

TABLE 3

| | CT | | | | |
|---|---|---|---|---|---|
| | 30 C. | 30 C. | 30 C. Press | 30 C. | 30 C. |
| | IDLE @ RMC | PTU @ RMC | Yes + dd @ RMC | Yes @ RMC | dd @ RMC |
| I | 35.1 | 37.9 | 38.6 | 38.1 | 38.5 |
| II | 41.4 | 55.2 | 51.8 | 53.6 | 48.2 |
| III | 36.2 | 36.5 | 37.3 | 36.9 | 37.7 |

In Table 3, for the same server nodes under five different pressures models, the temperature differences of three fans in the area where the server nodes are located is reduced. The minimum temperature difference is 10.2° C. and the maximum temperature difference is 23.6° C. Air conduct II cools down around 3° C. As can be seen from the result, the extended heat sink provided by the embodiment can achieve the same heat dissipation effect at a lower fan speed, thereby reducing the power consumption of the fans.

In another implementation, since the intensification of the RACK type server is high, the sever nodes have no covers in the open design. There is a gap between the CPU heat sink on the current server node and the chassis of the previous server node. The airflow blown by fans in the area where the current server node is located can freely pass through the gap between the two chassis. In a sense, the airflow passing through the CPU heat sink can be reduced by the gap between the two chassis. However, the heat dissipation may be undesired. In one embodiment, the elastic thermally conductive material is used as a heat conduction connector adhered to the CPU heat sink. The heat conduction connector contacts the chassis of the upper server nodes, and is filled in a gap between the two chassis. For example, the elastic thermally conductive material is a viscous heat-dissipating foam material. The chassis of the upper server nodes is used as the thermal extension, so that at least part of the heat absorbed by the heat conductor is transferred to the chassis of the upper server node by the elastic heat conduction connector. Because the area of the upper chassis is larger than the CPU area, the cooling effect of the CPUs in the current server nodes can be effectively improved. Specifically, as shown in FIG. 4, by adding an elastic thermally conductive material, the heat generated by the heating element is effectively dissipated by the chassis of the upper node.

Figure 10:
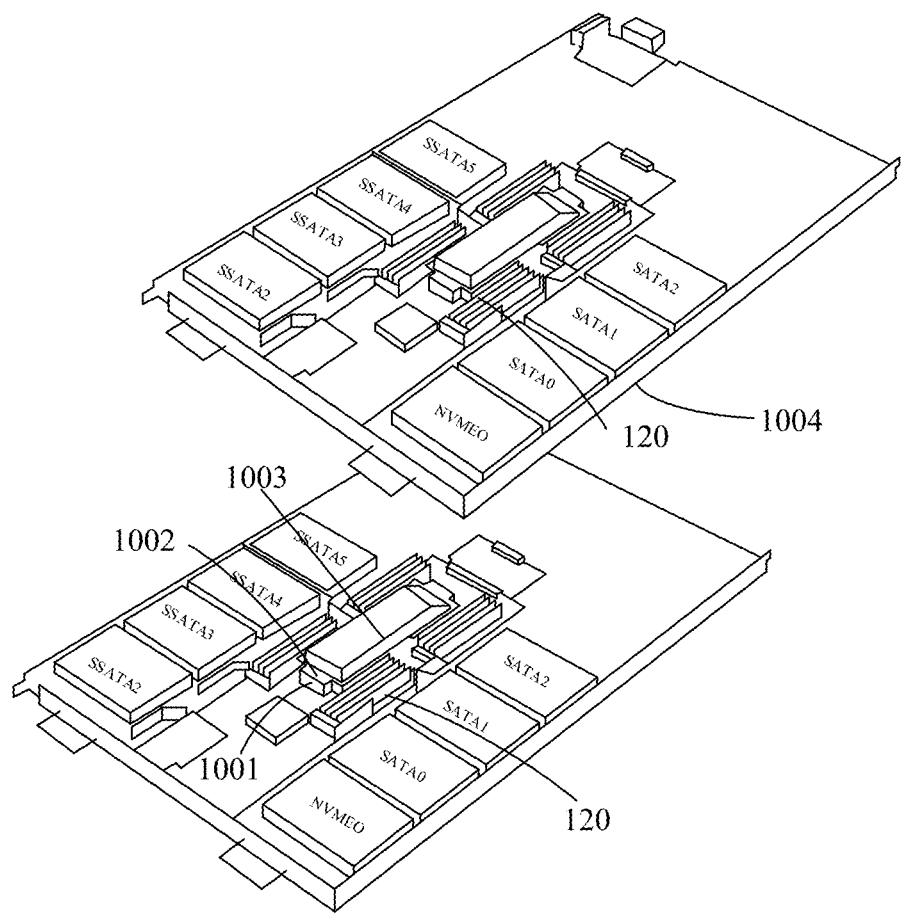
FIG. 10 illustrates another structural diagram of heat dissipation for CPU heat consistent with the disclosed embodiments

FIG. 10 illustrate another structural diagram of heat dissipation for CPU heat consistent with the disclosed embodiments. As shown in FIG. 10, the structure includes a heating element (CPU) 1001, a heat conductor (heat sink) 1002, a heat conduction connector 1003, and a thermal extension 1004. The heat conductor 1002, the heat conduction connector 1003 and the thermal extension 1004 are independently disposed.

Specifically, an elastic thermally conductive material is adhered to the CPU heat sink. The thermally conductive material is the heat conduction connector 1003. Moreover, the heat conduction connector may be formed in a three-dimensional trapezoidal shape with the height slightly larger than the gap of 0.4 cm between the heat sink and the chassis of a server node above the current server node. The chassis of the upper server node is the thermal extension 1004. Through such design, when a user performs the extraction operation for the current server node, the insertion and removal operations for the current server node can be successfully completed due to the elastic thermally conductive material and the trapezoidal angle setting In addition, since the degree of integration of the RACK type server is high, the sever nodes have no cover in the open design. There is a gap between the CPU heat sink on the current server node and the chassis of the previous server node. The airflow blown by fans in the area where the current server node is located can be freely passed through the gap between the two chassis. Accordingly, the airflow passing through the CPU heat sink can be reduced by the gap between the two chassis. However, the heat generated by the CPU is only poorly cooled by the gap between the two sever nodes. By using a resilient thermally conductive material, such as a viscous heat-dissipating foam material adhered to the CPU heat sink, the thermally conductive material contacts the chassis of the upper server node to fill the gap. When the CPU generates heat, through the elastic thermally conductive material, at least part of the heat can be conducted by the heat sink on CPUs to the chassis of the upper server node. The heat absorbed by the heat sink is first evacuated by the chassis of the upper server node, the fan in the area where the upper server node is located dissipates heat on the chassis of the upper server node. Therefore, the cooling effect of the CPU in the current server node can be effectively improved. The cooling effect of the fan for the CPU is shown in Table 4 by the solution of dissipating heat on the chassis of the upper server node.

TABLE 4

| | CT | | | | |
|---|---|---|---|---|---|
| | 30 C. | 30 C. | 30 C. Press | 30 C. | 30 C. |
| | IDLE @ RMC | PTU @ RMC | Yes + dd @ RMC | Yes @ RMC | dd @ RMC |
| I | 34.8 | 37.2 | 37.8 | 37.6 | 37.3 |
| II | 41.2 | 54.5 | 51.1 | 52.7 | 47.8 |
| III | 35.0 | 35.5 | 36.3 | 36.2 | 36.9 |
| Fan speed | 3016 | 3749 | 3563 | 3626 | 3381 |
| Fan power | 7.9 | 13.2 | 11.9 | 12.2 | 10.2 |

In Table 4, by connecting the CPU heat sink to the chassis of the adjacent upper node, under the same ambient temperature and five different models, compared to Table 2, the fan speed and the power are reduced by at least 121 RPM and 0.8 W respectively. Compared to Table 2, the maximum reduction of the fan speed and the power in Table 4 are 249 RPM and 2.4 W respectively. By using the properties of chassis such as good thermal conductivity and large heat dissipation region, under the same conditions, the temperatures of the CPU and the air outlet can be effectively reduced, thus the speed and power consumption of the fan are reduced and the product competition is improved.

S703: dissipating heat conducted to the thermal extension by a heat sink in a region where the thermal extension is located.

In the embodiment, the heat sink may be a fan, and the heat sink in the region where the thermal extension is located is disposed corresponding to the heat sink in the region where the heating element is located. After the heat conductor absorbs at least a part of the heat through the thermal extension for the first heat dissipation, the fan in the region where the thermal extension is located further evacuates the heat after the first evacuation, so that the heat generated by the CPU can be effectively dissipated and the power consumption of fan can be reduced.

The above descriptions are only the specific embodiments of the present disclosure. The scope of the present disclosure is not limited thereto. Those skilled in the art can easily think of changes or substitutions within the technical scope of the present disclosure. The changes and substitutions should be covered within the protection scope of the present disclosure. The protection scope of the present disclosure shall be subject to the protection scope of the claims.

What is claimed is:

1. A heat dissipation structure, comprising:
   a substrate comprising a thermally conductive material, wherein a first surface of the substrate has at least one contact region configured to be in contact with at least one heating element to be cooled and external to the heat dissipation structure, and the at least one contact region is located at a predetermined position with respect to the substrate;
   one or more cooling fins connected to the first surface of the substrate; and
   an extended heat sink, comprising:
      a heat conduction connector being disposed over the first surface of the substrate, connecting the at least one contact region, wherein the heat conduction connector is connected to the one or more cooling fins to form a space for disposing the at least one heating element to be cooled;
      a thermal extension located beyond the at least one contact region, wherein the thermal extension is connected to the substrate by the heat conduction connector and the one or more cooling fins, and the heat conduction connector conducts heat absorbed by the substrate to the thermal extension.

2. The heat dissipation structure according to claim 1, wherein:
   at least one of the cooling fins includes one or more through holes.

3. The heat dissipation structure according to claim 2, wherein:
   the at least one contact region includes two contact regions;
   at least one of the through holes penetrates two opposite surfaces of the cooling fins and does not contact the substrate; or
   at least one extension direction of the through hole is perpendicular to the respective geometric centers of the two contact regions; or
   at least two of the cooling fins are in partial contact with each other; or
   at least two of the cooling fins have a space between themselves.

4. The heat dissipation structure according to claim 1, wherein:
   the heat conduction connector and the at least one heating element are in a same plane, and the thermal extension and the at least one heating element are in the same plane.

5. An electronic device, comprising:
   one or more first devices each having a corresponding cooling surface to be cooled;
   a heat dissipation structure including one or more heat sinks disposed on the corresponding cooling surface, wherein the heat dissipation structure includes:
      a substrate comprising a thermally conductive material and having a first surface with at least one contact region being in contact with the corresponding cooling surface or different regions of the corresponding cooling surface of the one or more first devices;
      a plurality of cooling fins connected to the substrate; and
      at least one second device being disposed in a space between at least two of the plurality of the cooling fins.

* * * * *